United States Patent
Hussell (10) Patent No.: US 9,215,792 B2
(45) Date of Patent: Dec. 15, 2015

(54) CONNECTOR DEVICES, SYSTEMS, AND RELATED METHODS FOR LIGHT EMITTER COMPONENTS

(71) Applicant: CREE, Inc., Durham, NC (US)

(72) Inventor: Christopher P. Hussell, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/839,130

(22) Filed: Mar. 15, 2013

(65) Prior Publication Data

US 2014/0265809 A1   Sep. 18, 2014

(51) Int. Cl.

| | |
|---|---|
| F21V 9/00 | (2015.01) |
| H05K 1/00 | (2006.01) |
| F21S 4/00 | (2006.01) |
| F21V 23/06 | (2006.01) |
| H05K 1/14 | (2006.01) |
| F21Y 101/02 | (2006.01) |
| F21Y 103/00 | (2006.01) |
| H01L 33/48 | (2010.01) |
| H05K 3/36 | (2006.01) |

(52) U.S. Cl.
CPC . *H05K 1/00* (2013.01); *F21S 4/003* (2013.01); *F21V 23/06* (2013.01); *H05K 1/142* (2013.01); *F21Y 2101/02* (2013.01); *F21Y 2103/003* (2013.01); *H01L 33/486* (2013.01); *H01L 2924/0002* (2013.01); *H05K 3/36* (2013.01); *H05K 2201/10106* (2013.01); *H05K 2201/10666* (2013.01); *Y10T 29/49117* (2015.01)

(58) Field of Classification Search
CPC ............ H05K 1/00; H05K 1/142; H05K 2201/10106; H05K 2201/10666; F21V 4/003; F21V 23/06

USPC ................................... 313/3; 362/219, 217.7
See application file for complete search history.

(56) References Cited

U.S. PATENT DOCUMENTS

| | | | |
|---|---|---|---|
| 4,946,547 A | 8/1990 | Palmour et al. | |
| 5,200,022 A | 4/1993 | Kong et al. | |
| RE34,861 E | 2/1995 | Davis et al. | |
| 6,914,194 B2 * | 7/2005 | Fan | 174/117 F |
| 7,213,940 B1 | 5/2007 | Van De Ven et al. | |
| 7,791,061 B2 | 9/2010 | Edmond et al. | |
| 8,058,088 B2 | 11/2011 | Cannon et al. | |
| 8,714,772 B1 * | 5/2014 | Levante et al. | 362/217.17 |
| 8,905,579 B2 | 12/2014 | Dobbins et al. | |
| 2006/0244622 A1 * | 11/2006 | Wray | 340/815.45 |
| 2007/0158668 A1 | 7/2007 | Tarsa et al. | |
| 2008/0128723 A1 * | 6/2008 | Pang | 257/98 |

(Continued)

OTHER PUBLICATIONS

Restriction Requirement for U.S. Appl. No. 13/838,654 dated Sep. 29, 2014.

(Continued)

*Primary Examiner* — Tracie Y Green
(74) *Attorney, Agent, or Firm* — Jenkins, Wilson, Taylor & Hunt, P.A.

(57) ABSTRACT

Connector devices and systems for light emitter components and related methods are provided. In some aspects, a connector device includes a body, at least a first trace, and a second trace. In some aspects, connector device can include multiple traces. The first and second traces can be disposed over portions of the body. In some aspects, portions of each of the first and second traces can be electrically and/or physically connectable to each of a first and a second light emitter component via an attachment material.

19 Claims, 5 Drawing Sheets

(56) References Cited

U.S. PATENT DOCUMENTS

| | | |
|---|---|---|
| 2008/0173884 A1 | 7/2008 | Chitnis et al. |
| 2008/0179611 A1 | 7/2008 | Chitnis et al. |
| 2008/0258130 A1 | 10/2008 | Bergmann et al. |
| 2009/0184333 A1* | 7/2009 | Wang et al. .................. 257/88 |
| 2009/0212304 A1* | 8/2009 | Wang et al. .................. 257/88 |
| 2009/0224265 A1* | 9/2009 | Wang et al. .................. 257/88 |
| 2010/0039806 A1 | 2/2010 | Roberts et al. |
| 2010/0053956 A1 | 3/2010 | Park et al. |
| 2010/0155763 A1 | 6/2010 | Donofrio et al. |
| 2010/0220479 A1 | 9/2010 | Yamashita et al. |
| 2011/0013400 A1 | 1/2011 | Kanno et al. |
| 2012/0235199 A1* | 9/2012 | Andrews et al. .............. 257/98 |
| 2013/0114255 A1 | 5/2013 | Schick et al. |
| 2013/0215610 A1 | 8/2013 | Tsai et al. |
| 2013/0329425 A1 | 12/2013 | Lowes et al. |
| 2014/0198497 A1 | 7/2014 | Shimizu et al. |
| 2014/0268728 A1 | 9/2014 | Hussell |

OTHER PUBLICATIONS

Photograph of Competitor LED Part dated at least as early as Mar. 11, 2013.

Non-Final Office Action for U.S. Appl. No. 13/838,654 dated Jan. 6, 2015.

* cited by examiner

CONNECTOR DEVICES, SYSTEMS, AND RELATED METHODS FOR LIGHT EMITTER COMPONENTS

TECHNICAL FIELD

The subject matter disclosed herein relates generally to connector devices, systems, and methods for use with light emitter components. More particularly, the subject matter disclosed herein relates to physical and/or electrical connector devices and systems for use with light emitting diode (LED) components, and related methods.

BACKGROUND

Light emitters, such as light emitting diodes (LEDs) or LED chips are solid state devices that convert electrical energy into light. LED chips can be utilized in light emitter components for providing different colors and patterns of light useful in various lighting and optoelectronic applications. For example, light emitter components can be used in various LED light bulb and light fixture applications and used as replacements for incandescent, fluorescent, and metal halide high-intensity discharge (HID) lighting applications.

Currently, one problem associated with conventional substrate based light emitter components which incorporate light emitters, such as LED chips, is that where a lighting system requires multiple components, there is currently not a device or method for electrically coupling or connecting such components other than via soldering multiple thick, bulky electrical wires to each component. Such wires can block, absorb, and/or otherwise interfere with light. Thus, the optical efficiency of the lighting components and/or the lighting system can become compromised. Other connectors that may be available are bulky and add considerable cost to produce devices and systems.

Accordingly, despite the availability of various light emitter components in the marketplace, a need remains for brighter, more cost-effective light emitter components and/or systems which can be efficiently connected via an efficient, cost effect, and/or reflective connector device. Such connector devices and systems can also make it easier for end-users to justify switching to LED products from a return on investment or payback perspective.

SUMMARY

In accordance with this disclosure, connector devices and systems for light emitter components, and related methods are disclosed herein and have improved performance. For example, connector devices and systems described herein can advantageously provide more efficient electrical and physical connections for light emitter components. Such connector device and systems can also be configured to improve reflection, improve light extraction from emitter components, and/or improve the manufacturability.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

The subject matter disclosed herein is directed to connector devices, systems, and methods for use with light emitters, such as solid state light emitting devices and light emitting diodes (LEDs) or LED chips. Connector devices, systems, and methods described herein can be adapted to exhibit improved performance, for example, improved efficiency, brightness, light extraction, thermal and/or optical efficiency. In some aspects, each of these improvements contributes to and/or can be provided at a lower cost than conventional components. In some aspects, each of these improvements can be appreciated by using at least one connector device as described herein, where the device is reflective to light, lightweight, and flexible. In some aspects, multiple light emitter components can be electrically and physically connected end-to-end via connector devices described herein.

Reference will be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the component or component in addition to the orientation depicted in the figures. For example, if the component or component in the figures is turned over, structure or portion described as "above" other structures or portions would now be oriented "below" the other structures or portions. Likewise, if the component or component in the figures are rotated along an axis, structure or portion described as "above", other structures or portions would be oriented "next to" or "left of" the other structures or portions. Like numbers refer to like elements throughout.

Unless the absence of one or more elements is specifically recited, the terms "comprising", including", and "having" as used herein should be interpreted as open-ended terms that do not preclude the presence of one or more elements.

Light emitter components according to embodiments described herein can comprise group III-V nitride (e.g., gallium nitride (GaN)) based LED chips or lasers. Fabrication of LED chips and lasers is generally known and only briefly described herein. LED chips or lasers can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si), and GaN. In one aspect, SiC substrates/layers can be 4H polytype silicon carbide substrates/layers. Other SiC candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861, U.S. Pat. Nos. 4,946, 547, and 5,200,022, the disclosures of which are incorporated by reference herein in their entireties. Any other suitable growth substrates are contemplated herein.

Although various embodiments of LED chips disclosed herein can comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based LED chips according to some embodiments of the present subject matter, for example, can be fabricated on growth substrates (e.g., Si, SiC, or sapphire substrates) to provide horizontal devices (with at least two electrical contacts on a same side of the LED chip) or vertical devices (with electrical contacts on opposing sides of the LED chip). Examples of vertical and horizontal LED chip structures are discussed by way of example in U.S. Publication No. 2008/0258130 to Bergmann et al. and in U.S. Pat. No. 7,791,061 to Edmond et al. which issued on Sep. 7, 2010, the disclosures of which are hereby incorporated by reference herein in their entireties.

One or more solid state light emitters such as LED chips, and notably, portions of components described herein such as portions of the substrate, lens, and/or traces can be at least partially coated with one or more phosphors. The phosphors can absorb a portion of light from the LED chip and emit a different wavelength of light such that the light emitter component emits a combination of light from each of the LED chip and the phosphor. In one embodiment, the light emitter component emits what is perceived as white light resulting from a combination of light emission from the LED chip and the phosphor. In one embodiment according to the present subject matter, a white emitting component can consist of an LED chip that emits light in the blue wavelength spectrum and a phosphor that absorbs some of the blue light and re-emits light in the yellow wavelength spectrum. The component can therefore emit a white light combination of blue and yellow light. In other embodiments, the LED chips emit a non-white light combination of blue and yellow light as described in U.S. Pat. No. 7,213,940. LED chips emitting red light or LED chips covered by a phosphor that absorbs LED light and emits a red light are also contemplated herein.

LED chips can be coated with a phosphor using many different methods, with one suitable method being described in U.S. patent application Ser. Nos. 11/656,759 and 11/899, 790, both entitled "Wafer Level Phosphor Coating Method and Devices Fabricated Utilizing Method", and both of which are incorporated herein by reference in their entireties. Other suitable methods for coating one or more LED chips are described in U.S. Pat. No. 8,058,088 entitled "Phosphor Coating Systems and Methods for Light Emitting Structures and Component Light Emitting Diodes Including Phosphor Coating" which issued on Nov. 15, 2011, and the continuation-in-part application U.S. patent application Ser. No. 12/717,048 entitled "Systems and Methods for Application of Optical Materials to Optical Elements", the disclosures of which are hereby incorporated by reference herein in their entireties. It is understood that light emitter components and methods according to the present subject matter can also have multiple LED chips of different colors, one or more of which can be white emitting.

FIGS. 1 through 7 are embodiments of connector devices and systems for use with light emitter components, and related methods. Light emitter components can comprise a substrate for supporting light emitters, such as LED chips. Connector devices, systems, and related methods described herein can advantageously be configured for providing more efficient physical and/or electrical connection between light emitter components. Connector devices and systems can also increase reflectively of light emitter components, which can advantageously improve brightness and light extraction therefrom.

Figure 1:
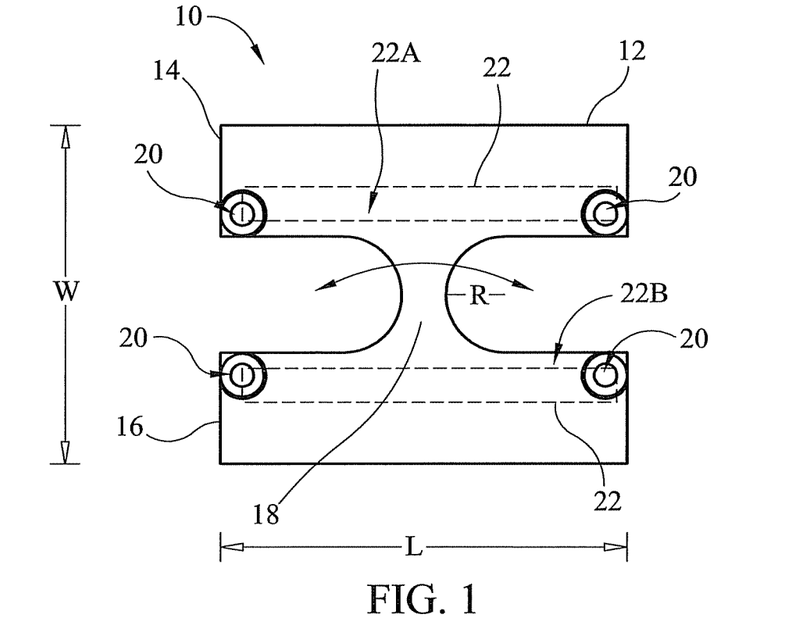
FIG. 1 is a top plan view illustrating a connector device for light emitter components according to one aspect of the disclosure herein.

FIG. 1 illustrates connector device, generally designated 10. As described herein, device 10 can be configured to physically and electrically connect one or more light emitter components to form a connector system. In some aspects, device 10 can comprise a substantially H-shaped body portion 12. However, any shape can be provided. In some aspects, body portion 12 can comprise a first body portion 14, a second body portion 16, and an intermediate body portion 18 disposed therebetween. Notably, device 10 can comprise flexible body and can bend or flex as indicated by the double sided arrow of FIG. 1. In some aspects, one or more portions of device 10 can be pivotal or flexible about intermediate body portion 18.

In some aspects, device 10 can comprise one or more openings or apertures, generally designated 20. Apertures can be adapted to physically and/or electrically couple device 10 to a light emitter component within a system. In some aspects, apertures 20 can provide an area for solder or other attachment material to settle or flow into when device 10 is physically attached to a component. The attachment material can facilitate physical and/or electrical connection between device 10 and a component (e.g., M, FIG. 3).

Figure 3:
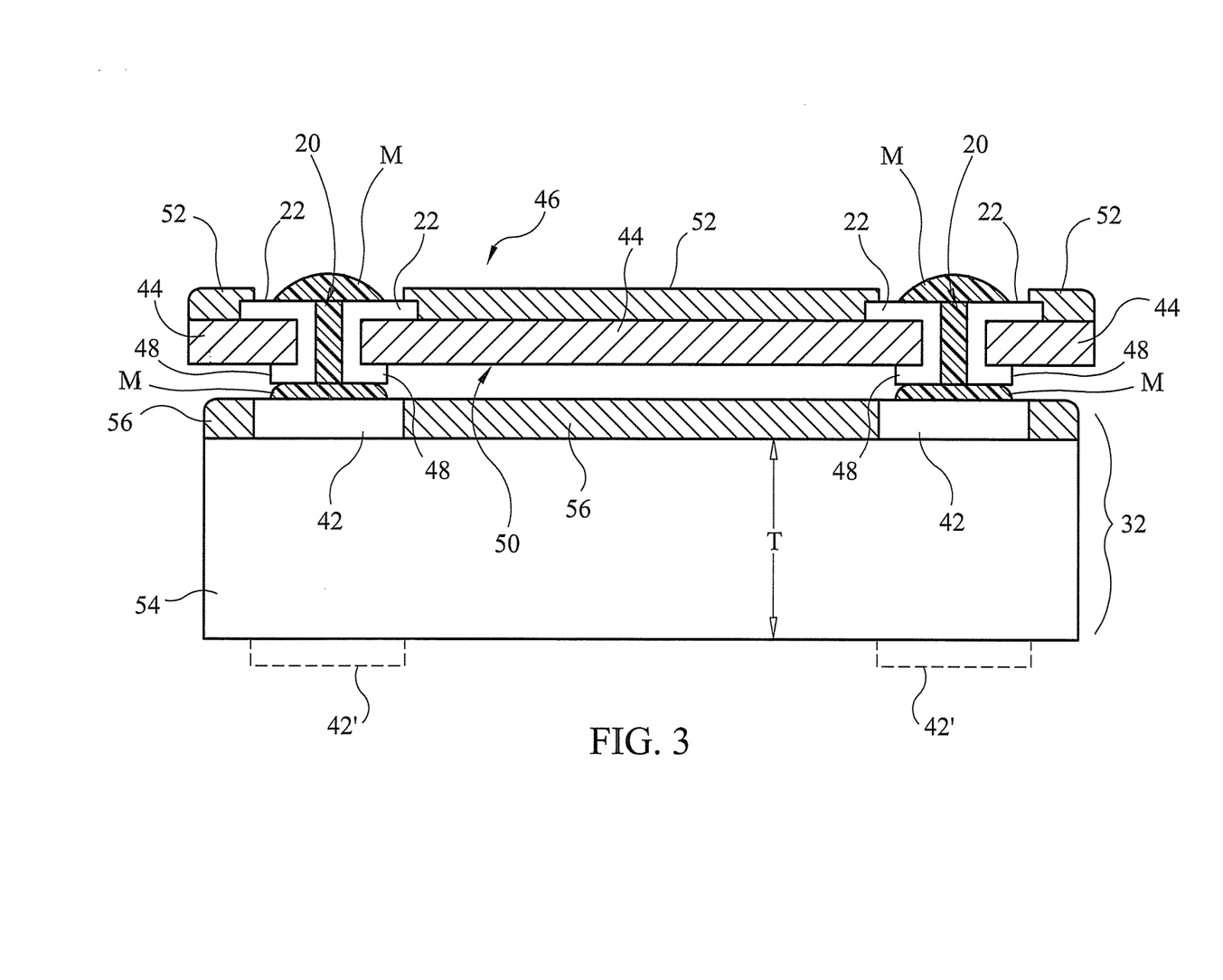
FIG. 3 is a sectional view illustrating the connector system of to FIG. 2.

In some aspects, device 10 can be soldered to a light emitter component (FIG. 3). Thus, apertures 20 can provide a conduit for solder and/or other attachment material to flow into and physically connect device 10 to another component upon curing or hardening of the solder. Any attachment method and/or material can be used. For example, one or more pins, rivets, or screws could also be provided at least partially through apertures 20 for physically securing device 10 to another component.

In some aspects, the inner walls of apertures 20 can be, but do not have to be at least partially plated and/or filled with an electrically conductive coating. That is, in some aspects apertures 20 comprise a through-hole or "via" that can electrically connect an electrically conductive portion of device 10 to another component. Inner walls of apertures 20 can optionally be plated with any suitable electrically conductive material. In some aspects, inner walls of apertures 20 can be plated with one or more thin layers comprising gold (Au), silver (Ag), copper (Cu), nickel (Ni), titanium (Ti), aluminum (Al), tin (Sn), platinum (Pt), palladium (Pd), any alloy thereof, any combination thereof, and/or any other suitable material that is electrically conductive.

In some aspects, apertures 20 can comprise any size (e.g., diameter), and any shape (e.g., round, non-round). In some aspects, apertures 20 can comprise semi-circular shaped portions disposed proximate opposing outermost ends or edges of body 12. In further aspects, apertures 20 can comprise slots disposed proximate opposing ends of body 12. Any size, shape, configuration, and/or location of apertures 20 can be provided and are contemplated herein. Or in some aspects, attachment areas other than apertures can be provided, which are not required which terminate at an end of device without any hole or slot can be provided.

Figure 2:
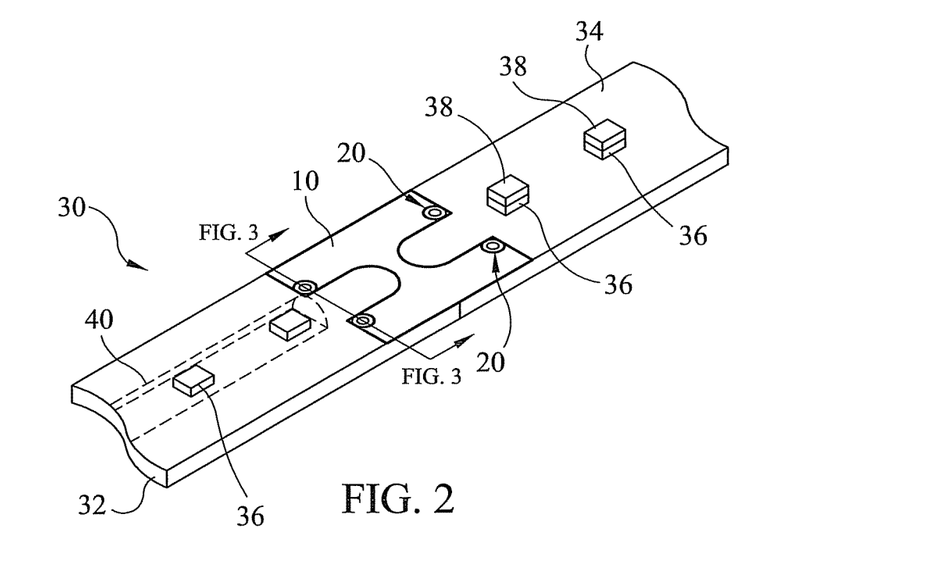
FIG. 2 is a top perspective view illustrating a connector system for light emitter components according to one aspect of the disclosure herein.

Still referring to FIG. 1, in some aspects device 10 can further comprise one or more electrical traces 22 disposed over the body 12 of device. In some aspects, device 10 can comprise at least two electrical traces 22 for electrically connecting a first component to a second component within a connector system (FIG. 2). In some aspects, device 10 can comprise more than two electrical traces 22 (e.g., multiple traces) for physically and electrically connecting multiple devices. Each trace 22 can comprise electrically conductive material for passing electrical signal or current between components. In some aspects, a first trace 22A can be configured to carry positive electrical signal and a second trace 22B can be configured to carry negative electrical signal, or vice versa. The electrical current or signal can be transferred component-to-component via device 10. Of note, traces 22 are denoted in phantom lines as they can be disposed internally within portions of device 10, and may not be visible from the outside. In some aspects, exterior or exposed traces 22 are contemplated and can be provided. In further aspects, traces 22 can comprise a combination of internal and external or exposed portions within body of device 10.

In some aspects, traces 22 can extend substantially a full length of the body 12 and/or can extend between portions of apertures 20 at opposing ends of the body. Traces 22 can comprise any suitable electrically conducting material, for example only and not limited to Cu, Au, Ag, Ti, Ni, or any combinations thereof. Traces 22 can be configured to communicate electrical current from a first component to a second component within a system (e.g., FIG. 2).

Still referring to FIG. 1, device 10 can have any suitable thickness and/or any suitable length or width. In some aspects, device 10 can for example have a thickness of approximately 50 μm or more, approximately 75 μm or more, approximately 100 μm or more, approximately 120 μm or more, or more than 150 μm. Any thickness can be provided.

Device 10 can for example have a length L of approximately 5 mm or more; approximately 10 mm or more; approximately 15 mm or more, or more than 20 mm. In some aspects, device can have a length of approximately 18 mm. Device 10 can further have a width W of approximately 5 mm or more; approximately 10 mm or more; approximately 15 mm or more; or more than 20 mm. In some aspects, length L can be substantially equal to width W. In other aspects, length L can be different than width W, and optionally a greater or smaller dimension. In some aspects, device 10 can comprise length L and width W of approximately 18 mm×15 mm, respectively. In some aspects, body 12 can comprise one or more curved surfaces proximate intermediate body portion 18. The one or more curved surfaces can comprise a radius R of approximately 2.5 mm, or more or less where desired. Other sizes, shapes, and configurations of device 10 can be provided and are contemplated herein.

FIG. 2 is a perspective view illustrating a connector system, generally designated 30. Connector system 30 can comprise a first light emitter component 32, a second light emitter component 34, and device 10 disposed therebetween. Device 10 can be physically and/or electrically connected to one or more attach surfaces disposed over of first component 32 and to one or more attach surfaces disposed over second component 34. In some aspects, attach surfaces comprise solder pads. In other aspects, attach surfaces can comprise one or more surfaces of a clamp, clip, slot, or aperture configured to attach to one or more apertures 20 or portions of device 10. In some aspects as described in FIGS. 3 and 4, device 10 can be soldered to attach surfaces of each of first and second components 32 and 34, respectively. Notably, device 10 can be adapted to electrically and physically connect to each of first and second devices 32 and 34 via solder or other attachment material (M, FIG. 3). Solder provides an electrical connection between at least one trace (22, FIG. 1) of device 10 and at least one electrically conductive attach surface of each of first and second components 32 and 34, respectively. In some aspects, solder can comprise a physical and electrical point of connection therebetween.

One or more light emitters, such as LED chips 36 can be disposed over each of first and second components 32 and 34, respectively. Other LED devices other than chips 36, for example, LED packages can be provided over each of first and second components 32 and 34. For example, in some aspects LED packages having a submount and optical element or lens can be provided instead of chips 36. Notably, LED chips 36 can comprise horizontal devices which can directly attach to one or more traces of each of first and second components. This can obviate the need for wirebonded LED chips 36, which can advantageously obviate the expense and time associated with wirebonding, and can also improve brightness or light extraction as light will not be blocked, absorbed, or otherwise interfered with via wirebonds. In some aspects, each LED chip 36 can comprise two electrical contacts or surfaces (e.g., bond pads) disposed on a bottom surface that can directly attach to traces of first and second components 32 and 34, respectively. Horizontal light emitters could also be provided, and could be wirebonded to electrical traces of first and second components 32 and 34. Any structure of LED chip 36 can be provided.

LED chips 36 can be physically and electrically attached to traces of first and second components 32 and 34, respectively, such as for example via adhesive, solder, epoxy, flux materials, eutectic materials, or via any other suitable attachment material as known in the art. In some aspects, first and second components 32 and 34, respectively, can comprise a substrate for supporting multiple LED chips 36. In some aspects, first and second components 32 and 34 can comprise a substrate of FR-4 composite or laminate material having traces provided thereon, a metal core printed circuit board (MCPC), a printed circuit board (PCB), a circuit, a flexible circuit, a ceramic substrate comprising flexible and/or adhesive traces, or a ceramic having electroplated traces. Components 32 and 34 can comprise any suitable substrate which can be capable of supporting one or more LED chips.

In some aspects, a plurality of LED chips 36 can be provided over each component. LED chips 36 can be disposed in a single line or row, an array, or multiple lines or rows. In some aspect, each line or row can comprise at least some serially connected chips extending down a body of each of first and second components 32 and 34, respectively. In some aspects for example, at least 10 LED chips 36 can be provided over each of first and second components 32 and 34, respectively. However, more or less than 10 LED chips 36 can be provided and are contemplated herein. LED chips 36 can be arranged in multiple strings of chips and/or LED chips 36 can be arranged in an array or multiple arrays. In some aspects, more than 10 LED chips 36 can be provided per component, in other aspects, more than 15 LED chips 36 can be provided per component 30, in other aspects, more than 20 LED chips 34 can be provided per component, in some aspects, more than 50 LED chips 36 can be provided per component.

The multiple LED chips 36 provided over each component can comprise a same and/or different colors and/or targeted wavelength range, including for example, being configured to emit light that is primarily red, primarily blue, primarily cyan, primarily green, primarily amber, primarily red-orange, primarily yellow, primarily white, and/or combinations thereof. For example, where multiple LED chips 36 are used per component, LED chips 36 can comprise the same, similar; and/or, different targeted wavelength bins including red, blue, cyan, green, amber, red-orange, and/or combinations thereof.

LED chips 36 can comprise any suitable dimension, size, structure, and/or shape. For example, square and/or rectangle LED chips 36 having straight cut and/or bevel cut sides are contemplated herein. In one aspect, LED chips 36 can comprise a chip having a length and/or width that is approximately 0.1 mm (e.g., 100 µm) or more, for example, LED chips 36 can comprise a length and/or width of approximately 0.1 to 0.5 mm; approximately 0.5 to 0.75 mm; approximately 0.75 to 0.85 mm; approximately 0.85 to 0.95 mm; or approximately 1 mm to 2 mm or more. Any sizes and/or shapes of LED chips 36 can be provided and are contemplated herein. In some aspects, first and second light emitter components 32 and 34, respectively, can comprise a plurality of light emitters that are each an identical size. In other aspects, light emitters of different sizes (large and small) can be used together within each component.

Still referring to FIG. 2 and in some aspects, an optical structure or optical layer 38 can optionally be provided over at least one LED chip 36 of at least one component. In some aspects, LED chips 36 can be disposed directly over components in a chip-on-board (COB) arrangement. In other aspects, LED packages can be provided directly over components described herein. In other aspects, optical layer 38 can be provided over each LED chip 36 in a string of LED chips (e.g., FIG. 6) over each component. In some aspects, optical layer 38 can be disposed over portions of each LED chip providing physical, mechanical, and/or chemical protection thereof. In other aspects, optical layer 36 can also assist in providing a desired color point of light of each component. For example, in some aspects optical layer 38 can comprise a phosphor or lumiphor adapted to absorb some of the light emitted by LED chips 36 and emit light of a different color. In some aspects, light emitted by LED chips 36 and light emitted by optical layer 38 can mix to form a neutral, cool, or white light for use in a lighting fixture. In some aspects, optical layer can comprise a phosphor or lumiphor adapted to emit yellow, red, blue, or green light upon activation by light emitted by LED chips 36.

In further aspects, other types or configurations of optical layers and/or optical elements can be provided over first and second components 32 and 34, respectively. For example, optical elements or layers of any size, shape, or material can be provided. In addition to providing color mixing attributes, optical materials can be configured to produce light output of a desired shape, beam pattern, and/or position light in a desired direction (e.g., omnidirectional, unidirectional, etc.), and can comprise a layer of encapsulant, one lens over the string of LED chips 36, and/or individual lenses over each LED chip 36.

In some aspects, an optical element 40 can be disposed over a component, where desired, and can comprise a layer of silicone encapsulant dispensed in a bead or row of encapsulant over each LED chip 36 in a given string or strings of LED chips. In some aspects, optical element 40 can comprise any material, such as an epoxy, plastic, glass, and/or silicone material, and can be provided using any method, such as encapsulating or molding. It is understood that optical element 40 can comprise can be at least partially be textured to improve light extraction and/or be coated with or contain optical conversion, wavelength conversion, light scattering, and/or reflective materials or particles, such as phosphors or light scattering particles.

In some aspects, at least a portion of optical element 40 can be at least partially concave with respect to the upper surface of each of first and second component 32 and 34, respectively. In some aspects, optical element 40 can be dispensed and then optionally cured upside down to produce the partially concave and/or curved cross-sectional shape. In some aspects, a mold can be used to produce the partially concave and/or curved cross-sectional shape. In some aspects, optical element 40 can comprise a substantially hemispherical, curved, domed, symmetric, or asymmetric shaped cross-section, however, any shape of optical element 40 can be provided. It is further understood that the optical element 40 can be adapted for use with a secondary lens or optics that can be included over optical element 40 by the end user to facilitate beam shaping. These secondary lenses are generally known in the art, with many of them being commercially available. It is further understood that one optical element 40 can be molded or provided over each LED chip 36, where desired.

In some aspects, where used, wavelength conversion material can be disposed within optical element 40. Wavelength conversion material can comprise one or more binders, phosphors, lumiphors, or a phosphor or lumiphor containing material and/or binder applied via any suitable technique. In one aspect, the wavelength conversion material can absorb at least some of the light emitted from any one of the multiple LED chips 36 and can in turn emit light having a different wavelength such that light emitter component emits a combination of light from one or more LED chips 36 and a phosphor. In some aspects, optical element 40 can be sprayed with phosphor or other wavelength conversion material. In some aspects, optical element 40 can be coated with a phosphor by lamination of a tape cast.

In one aspect, first and second components 32 and 34, and other light emitter components shown and described herein can emit light that is perceived as white light of approximately 2700 to 7000K, such as cool white (CW) light around 6000K or warm white (WW) light around 3000K. In one aspect, one or more LED chips 36 selected for use can comprise wavelengths targeting CW or WW light upon, for example, mixing with light emitted from the phosphors or a phosphor containing material. Any suitable wavelength bin and/or phosphor combination can be selected depending upon the application and desired light emission. Phosphors can be adapted to emit light that is yellow, green, blue, red, and/or combinations thereof upon absorbing light emitted by one or more LED chips 36. In some aspects, light emitter components shown and described herein such as first and second components 32 and 34, respectively, can be adapted to emit approximately 3500 lumens (lm) at approximately 5000 K and approximately 31 Watts (W). In other aspects, light emitter components shown and described herein can be adapted to emit approximately 2400 lm at approximately 5000K and approximately 18 Watts.

FIG. 3 illustrates a sectional view of a portion of a portion of first component 32 and device 10 along line 3-3 in FIG. 2. As FIG. 3 illustrates, device 10 can be physically and electrically connected to component 32 via a solder material or other attachment material, generally designated M. Material M can flow into and/or at least partially be disposed within a portion of apertures 20 of device 10. In some aspects, material M can flow through and/or extend through a portion of apertures 20 and physically and electrically connect device 10 to attachment areas 42 of first component 32.

Devices and light emitter components described herein can each comprise multiple layers of material. In some aspects, device 10 can comprise a base layer 44 of material. Base layer 44 can comprise any suitable material including, for example, a substantially electrically insulating layer of material, such as a ceramic or dielectric. In some aspects, base layer 44 can comprise a layer of ceramic, glass, FR4 (or FR-4) or related materials, silicon, quartz, plastic, or any other suitable material. In some aspects, FR4 materials can comprise any materials within the accepted international grade designation for fiberglass reinforced epoxy laminates that are flame retardant. In some aspects, base layer 44 can comprise a laminate structure or laminate material.

In some aspects as discussed with respect to FIG. 1, device 10 can further comprise a layer of electrically conductive material, such as one or more traces 22. In some aspects, trace 22 can extend from apertures 20 disposed at one end of device 10 to apertures 20 extending at a second, opposing end of device 10. By connecting to apertures, multiple components can be physically and electrically coupled via device 10. In some aspects, trace 22 can be disposed on a first side 46 (e.g., a front side) only. In other aspects, device 10 can comprise trace 48 components on a second side 50 as well (e.g., a back side) thereby comprising a two-sided or double-sided connector device 10. Trace 48 on second side 50 can be optional.

Trace 22 (i.e., and trace 48, where a double-sided device is provided) can comprise any type of electrically conductive material such as a metal or metal alloy. In some aspects, traces 22 and 48 can be adapted to electrically communicate directly with one or more LED components (e.g., first and second components 32 and 34) via solder or other method of physical and/or electrical attachment. At least a portion of traces 22 and 48 can be exposed on a surface of device 10 about apertures 20. In some aspects, traces 22 and 48 can be fully exposed over device 10. Traces 22 and 48 can comprise a layer one or more materials such as, for example, Cu, Ag, Pt, Au, Sn, electroless nickel immersion gold (ENIG), Al, combinations thereof, and/or any other electrically conductive material(s) where desired.

Still referring to FIG. 3 and in some aspects, an optional non-metallic material 52 can be provided over, about, and/or adjacent portions of each trace 22 and 48, where a double-sided device 10 is provided. In some aspects, non-metallic material 52 can comprise a plastic, thermoplastic, or polymeric material such as a layer of solder mask. In some aspects, non-metallic material 52 can be reflective to light and/or optically reflective. Non-metallic material 52 can comprise a white or silvery white color. Notably, device 10 can be reflective to light, and therefore, have improved properties over existing connecting devices which may block, absorb, or otherwise interfere with light. Device 10 can advantageously improve reflection and, therefore, light extraction per LED component (e.g., first and second components 32 and 34).

In some aspects, non-metallic material 52 can comprise a liquid curable solder mask material. Non-metallic material 52 can be disposed adjacent portions of traces 22, 48 and apertures 20 and can be disposed over portions of base layer 44. In some aspects, portions of non-metallic material 52 can optionally be covered or layered with an optical conversion or wavelength conversion material, such as at least one phosphor, lumiphor, and/or more than one phosphoric or lumiphoric material, where desired.

Still referring to FIG. 3, first component 32 can comprise a substrate having one or more layers of material. In some aspects, first component 32 can comprise a substantially insulating core layer 54 of material, such as a ceramic or dielectric layer of material. Core layer 54 can comprise a layer of ceramic, glass, FR4 (or FR-4), silicon, quartz, plastic, or any other suitable material. In some aspects, core layer 54 can comprise a laminate structure or laminate material. Core layer 54 can comprise any suitable thickness T, for example, approximately 0.1 to 0.5 mm; 0.5 to 1 mm; or more than 1 mm. Any suitable thickness T can be provided.

In some aspects, component 32 can further comprise an electrically conductive portion or conductive layers of material. In some aspects, conductive layer can comprise one or more traces (FIG. 4) and attachment areas 42. The one or more conductive layers can be provided or disposed over portions of core layer 54 via electroplating techniques, electroless plating techniques, immersion plating techniques, adhesive materials (e.g., such layers can comprise flexible stickers or flexible conductive tape), or any other suitable method of applying metal to a core or base layer. Traces (FIG. 4) and attachment areas 42 can comprise any electrically conductive material or materials such as a metal or metal alloy. In some aspects, attachment areas 42 can be adapted to electrically communicate directly with device 10 via solder or attachment material M. Conductive layers of first component 32, such as traces and/or attachment areas 42 can comprise Cu, Ag, Pt, Au, Sn, electroless nickel immersion gold (ENIG), Al, combinations thereof, and/or any other electrically conductive material(s). Attachment areas 42 and/or traces (FIG. 4) can comprise areas of exposed material, and areas of internally disposed material. Attachment areas 42 and/or traces (FIG. 4) can be at least partially covered with a non-metallic layer of material 56 which can be substantially electrically insulating and reflective to light.

In some aspects, non-metallic layer of material 56 can comprise a reflective material, such as a solder mask material. Non-metallic layer of material 56 can, for example, comprise a white or silver-white liquid curable material. Non-metallic layer of material 56 can be disposed adjacent portions of attachment areas 42, traces (FIG. 4), and can be disposed over portions of core layer 54. Non-metallic layer of material 56 can further improve the brightness and/or overall optical performance of first component 32 as it can be adapted to reflect light. Portions of non-metallic layer of material 56 and/or attachment areas and traces can optionally be covered or layered with an optical conversion or wavelength conversion material, such as at least one phosphor, lumiphor, and/or more than one phosphoric or lumiphoric material.

As the broken lines in FIG. 3 illustrate, component 32 can comprise conductive traces or attachment areas 42" on a back side of the component, opposing the side to which device 10 is shown connected. Thus, component 32 can also comprise a double-sided device in some aspects. Attachment areas 42" are indicated in phantom lines, as they are optional. This can be advantageous where a multi-directional and/or omni-directional lighting product is desired. Component 32 could be provided in a lighting fixture or elongated bulb and emit light in more than one direction, as LED chips could be connected to more than one side of component 32.

Figure 4:
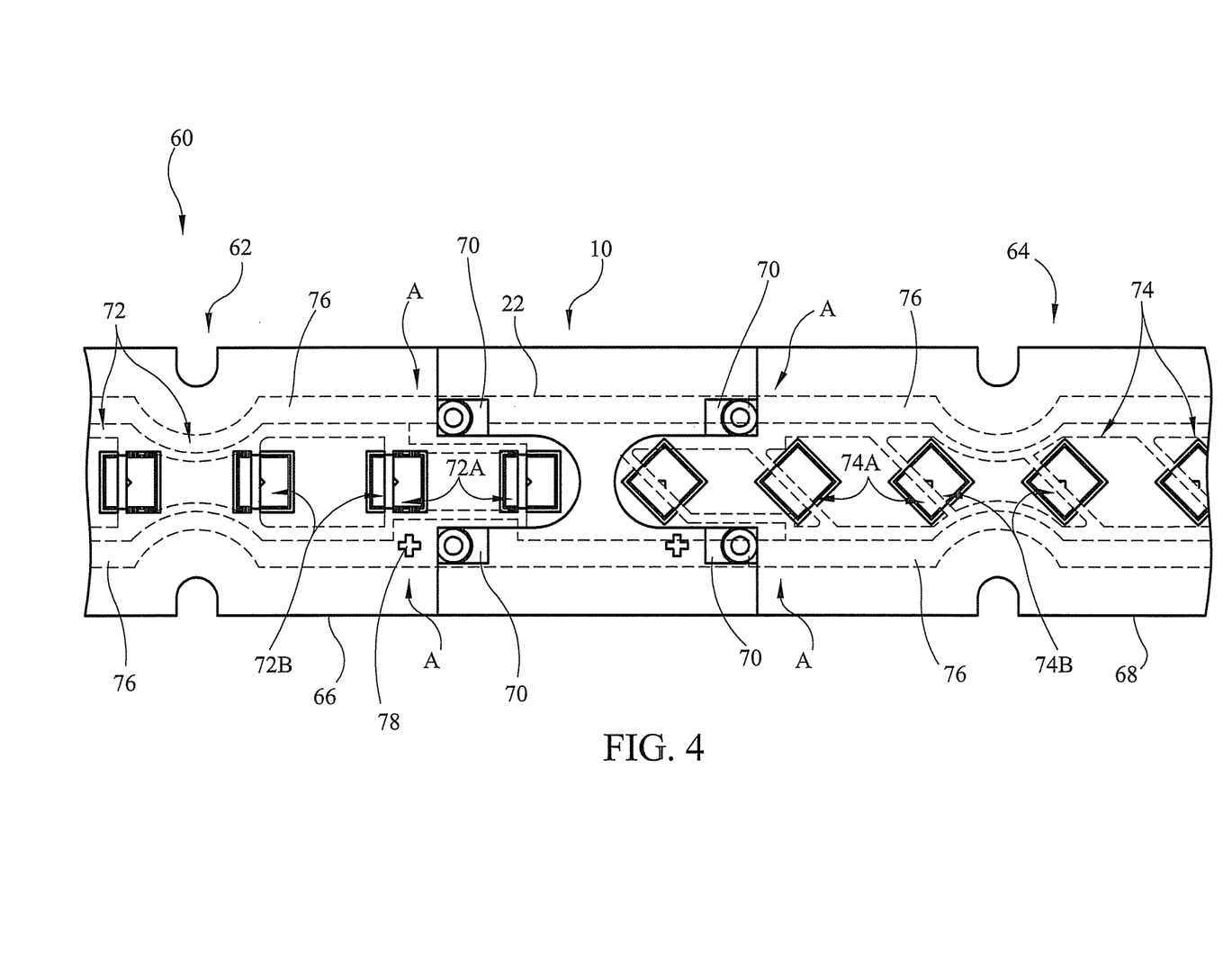
FIG. 4 is a top plan view illustrating a connector system for light emitter components according to a further aspect of the disclosure herein.

Referring now to FIG. 4, a more detailed top plan view of a connector system, generally designated 60, is illustrated. In some aspects, connector system 60 comprise device 10 disposed between a first light emitter component 62 and a second light emitter component 64. First and second light emitter components 62 and 64 can be similar in form, function, and appearance to previously described components 32 and 34, however, LED chips are not shown for convenience and for providing more detail regarding each component.

Each of first and second components 62 and 64, respectively, can comprise a first and a second panel substrate 66 and 68, respectively, for supporting one or more solid state light emitters, such as one or more LED chips (36, FIG. 2). In some aspects, panel substrates 66 and 68 can comprise a multi-layered substrate comprising a core layer, multiple conductive portions disposed over the core layer, and a reflective non-metallic layer, each of which have been previously described in FIG. 3.

In some aspects, each panel substrate 66 and 68 can comprise an elongated body adapted for use in strip lighting applications; however, any application and/or any sizes or shapes of substrates 66 and 68 are contemplated and can be provided. In some aspects, multiple LED chips (e.g., 36, FIG. 2) can be supported and provided over portions of each substrate 66 and 68. A plurality, an array, and/or any pattern, design, and/or arrangement of LED chips (not shown) can be provided over each component and respective substrate. LED chips can be arranged in any suitable configuration, such as for example in a substantially straight, linear line configuration, in a diagonal line configuration, in a "checkerboard" arrangement, wherein LED chips alternate above and/or below a substantially straight line, or in a pattern or array. In other aspects, LED chips can be arranged diagonally and/or angled with respect to each other over conductive portions of each substrate 66 and 68. Any configuration or arrangement of LED chips can be provided and is contemplated herein.

In some aspects, each of first and second components 62 and 64 comprise multiple conductive portions for providing electrical current to LED chips disposed thereon. In some aspects, each of first and second components 62 and 64 comprise attachment areas 70 disposed proximate the ends of components. When connected via device 10, the ends of each of first and second components can substantially abut; however, ends could also be spaced apart. Device can connect to attachment areas 70 via soldering, as previously described. Once physically connected to components via soldering, electrical current can pass from one component, through device 10, and into at least one other component. In some aspects, electrical current can be communicated between multiple devices 10 via traces 22. In some aspects, attachment areas 70 can comprise a solder pad comprising exposed metal, such as exposed Cu, Ag, Pt, Au, tin (Sn), ENIG, Al, combinations thereof, and/or any other electrically conductive material(s). In other aspects, attachment areas 70 can electrically connect with portions of device 10 or with portions of an electrical power source (not shown) for sending current into and out of multiple adjoined light emitter components.

In some aspects, each of first and second components 62 and 64, respectively, can comprise multiple traces to which multiple LED chips (FIG. 2) can be disposed and/or directly connected. First component 62 can comprise multiple traces, generally designated 72. Second component can comprise multiple traces, such as multiple traces, generally designated 74. Each trace 72 and 74 can comprise a pair of traces 72A and 72B and 74A and 74B. The width of each trace is denoted by the arrows, and each trace 72A, 72B, 74A, and 74B can comprise internal portions (in phantom lines) and exposed metal portions (solid lines). LED chips are configured to directly attach toe exposed portions of traces 72A, 72B, 74A, and 74B. Each pair of traces can comprise an anode cathode pair for passing electrical current into and out of serially connected LED chips or packages (not shown) attached thereto for causing the illumination thereof. As FIG. 4 illustrates, portions of traces 72 and 74 can be exposed (e.g., in solid lines) on a surface of each component, and other portions of traces 72 and 74 can be internally disposed within a portion of each component, as are indicated in phantom lines.

That is, in some aspects traces 72 and 74 of respective first and second components 62 and 64, respectively, can comprise an exposed portion designated in solid lines and an internally disposed portion designated in broken lines. The exposed portions can be exposed on an upper (or lower) surface of each respective component. The internally disposed portions are denoted in phantom lines, as they are not visible from outside of the components. Internal portions can be disposed between, for example, a core layer and a non-metallic layer of each component, for example, such as between an FR4 layer and a layer of solder mask as described in FIG. 3. Notably, LED chips (not shown) can be adapted to directly attach to exposed portions of traced 72 and 74 without requiring wirebonds. In some aspects as described further below, LED devices including LED packages (not shown) can be provided over components described herein, and can have back side contacts disposed on a submount or substrate which can be adapted to attach to traces 72 and 74. In some aspects, LED chips and/or LED devices such as packages can directly attach to traces 72 and 74 via solder, epoxy, flux or eutectic materials, or any other suitable adhesive material.

Notably, electrical current can travel down each component 62 and 64 and into and out of LED chips (not shown) of each of first and second components 62 and 64, respectively, by passing into and out of pairs of traces, without requiring wirebonds. This can be advantageous, as first and second components 62 and 64 can be more efficient. As FIG. 4 illustrates, traces 72 and 74 can comprise areas over which LED chips (not shown) can be mounted. LED chips can be provided over traces 72 of first component 62 in a substantially linear configuration. LED chips (not shown) can be provided over traces 74 of second component 64 in a substantially angled configuration over substrate 68, and each chip can be angled with respect to each other. In further aspects as illustrated in FIG. 4, portions of traces 74A and 74B can be angled with respect to each other. This can be advantageous as angling light emitters over angled traces 74A and 74B can reduce an amount of light blocked by light emitters over substantially linearly arranged, non-angled emitters. Thus, angling emitters and/or respective traces can improve emission from device, and improve luminous intensity provide by respective components.

In some aspects, LED packages, as opposed to chip on board (COB) arrangements of LED chips (e.g., 36, FIG. 2) can be provided over angled traces 74A and 74B. In some aspects, LED packages can comprise a submount or substrate, at least one LED chip disposed over the submount, and an optical element disposed over portions of the LED chip and/or submount. In some aspects, LED packages such as those disclosed in commonly assigned U.S. patent application Ser. No. 13/649,052, filed on Oct. 10, 2012 can be provided over traces 74A and 74B, the disclosure of which is hereby fully incorporated by reference herein. For example, in some aspects LED packages shown in FIGS. 4 and 5 of U.S. application Ser. No. 13/649,052 can be provided over angled traces 74A and 74B. Notably, packages can have two bottom contacts adapted to be physically and electrically connected to traces 74A and 74B. Such packages can have substantially domed or hemispherical shaped optical elements, or substantially cube shaped optical elements.

In some aspects, each of first and second components 62 and 64, respectively, can comprise multiple internally disposed bus bars 76. Bus bars are illustrated in phantom lines, as they may not be visible from the exterior of each of first and second components. In some aspects, bus bars 76 can be adapted to convey electrical current between attachment areas 70 of respective components. That is, bus bars 76 can convey electrical current internally a length of each connector, between respective positive and negative terminals (e.g., positive and negative attachment areas 70 at each end of each component). The electrical polarity of at least one side of each component can be designated by a signal or indicator 78, such as a "+" or "−" sign. Bus bars 76 can extend between one or more attachment areas 70 of a same polarity for transferring signal to ends of boards (e.g., components), where the ends can be connected to device 10 and/or to a power source (not shown).

Notably, portions of bus bars 76 can be continuous portions of attachment areas 70, as illustrated by areas A. That is, attachment areas 70 can comprise exposed portions shown in solid lines and can merge with portions of bus bars 76 proximate areas A. Thus, bus bars 76 can physically and electrically communicate with attachment for "bussing" electrical current down sides of each component via bus bars 76 and into and/or between respective attachment areas 70 (e.g., between two areas 70 on the "+" side and two areas 70 the other side). In some aspects, two substantially parallel bus bars 76 can be provided on opposing edges of each component. In some aspects, bus bars 76 can be parallel with a longitudinal axis of component. Each of the parallel bus bars 76 can comprise an opposing electrical polarity, such that together, they form and anode cathode pair communicating signal to respective attachment areas 70 and into strings of LED chips and/or LED devices (e.g., packages).

Figure 5A:
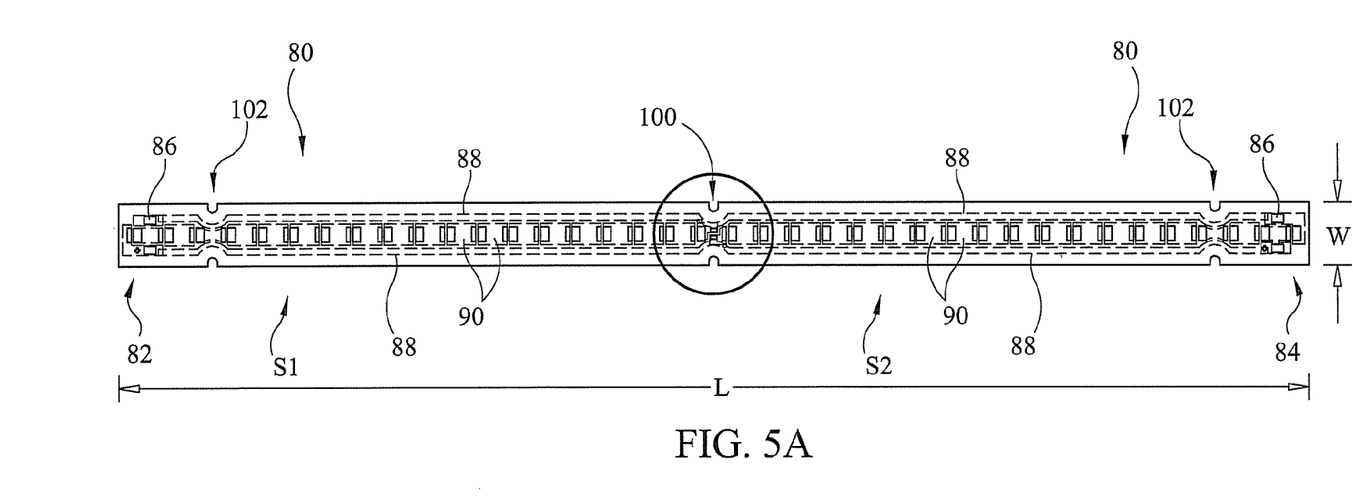
FIGS. 5A and 5B are top plan and detail views illustrating a light emitter component of a connector system according to one aspect of the disclosure herein.

Referring now to FIG. 5A, a light emitter component, generally designated 80 is illustrated. Component 80 can be similar in form and function to previously described components, however, component 80 can also comprise further novel aspects.

Component 80 can comprise a first end 82 and a second end 84. One or more exposed attachment areas 86 can be provided at each end. In some aspects, two attachment areas 86 are provided at each end, and each attachment area comprises a different electrical polarity. Thus, a pair of attachment areas 86 at each end can form an anode/cathode pair. Attachment areas 86 can be configured to physically and electrically connect to a power source (not shown) or to portions of a connector device (10, FIG. 1) via epoxy, solder, welding, adhesive, or any other suitable materials. As described above with respect to FIG. 4, at least one bus bar 88 can be provided between portions of or more attachment areas 76. Bus bars 88 can be internally disposed within component 80, and are illustrated in phantom lines.

In some aspects, bus bars 88 can be configured to electrically convey or "bus" electrical current from a power source, down a length of each component, and into other components, where desired. In some aspects, two substantially parallel bus bars 88 can be provided per component and can be disposed along opposing edges. In some aspects, bus bars 88 can be substantially parallel to outermost lateral edges of component 80. In some aspects, traces for one or more strings of LED chips (not shown) can be provided between each substantially parallel bus bar. More than two bus bars 88 can be provided and are contemplated herein.

In some aspects, multiple traces 90 can be disposed between bus bars 88. In some aspects, bus bars 88 can be provided proximate outermost edges of component 80. In some aspects, traces 90 can comprise multiple anode cathode pairs adapted to pass electrical current into and out of LED chips or packages (not shown), which can be directly attached thereto. In some aspects, traces 90 can comprise exposed portions (e.g., illustrated in solid lines) and internal portions disposed between one or more layers of component 80. The internal portions are illustrated in phantom lines, as they may not be visible from outside component 80. Together, the internal and external portions of traces 90 comprise a single layer or portion of conductive material. In some aspects, a non-metallic reflector (e.g., a solder mask or plastic material) can be disposed over portions of traces 90, rendering such portions non-visible from outside of component 80.

In some aspects, component 80 can be any suitable size or dimension, for example, any suitable length L and/or any suitable width W. Any suitable thickness can also be provided (e.g., T, FIG. 3). In some aspects for example, component 80 can have a length of approximately 20 millimeters (mm) or more, approximately 100 mm or more, approximately 150 mm or more, approximately 200 mm or more, approximately 250 mm or more, or more than approximately 300 mm in length L. In some aspects, component 80 can have a width W of approximately 5 mm or more, approximately 10 mm or more, approximately 15 mm or more, approximately 20 mm or more, or more than approximately 25 mm. In some aspects, component 80 can have an overall length L and width W of approximately 262.5 mm×15 mm, respectively. Components described herein can have any suitable shape, for example, such as a square shape, a rectangular shape, a non-rectangular shape, a circular shape, a curved shape, a symmetric shape, an asymmetric shape, and/or any other shape. Any size, shape, and/or thickness of components can be provided herein.

In some aspects, component 80 can comprise a substantially flat upper surface upon which one or more LED chips (not shown) can be linearly disposed along a same planar upper surface of the component substrate. In some aspects, component 80 can be adapted for incorporation into a lighting fixture, bulb, or system, such as a tube light, string light, bi-pin light bulb, or any other directional lighting bulb fixture or system (e.g., FIG. 7). In some aspects, a single component 80 can be used in a fixture or system, in other aspects, multiple, serially or parallel connected components 80 can be used in a fixture or system.

Figure 5B:
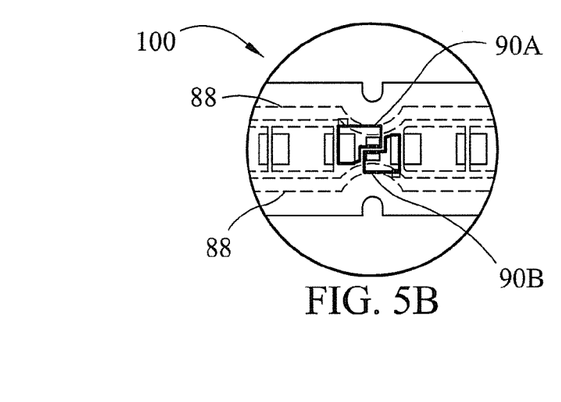

Still referring to FIG. 5A and notably, one or more of LED chips (not shown) can electrically connect to portions of bus bars at intermediate portions, generally designated 100. A detailed view of intermediate portion 100 is shown in FIG. 5B. As FIG. 5B illustrates, traces 90 can for example comprise pairs of at least a first trace 90A and a second trace 90B. First and second traces can comprise opposing electrical polarity. In some aspects, as FIG. 5B illustrates, at least one first trace 90A can physically and/or electrically merge with a portion of one bus bar 88 disposed on one edge of device. The areas where bus bars 88 and traces physically meet are outlined for visibility purposes. In some aspects, the merged can transfer electrical current into and/or terminate electrical current at a first string of LED chips which can be connected in series over as indicated by S1. A second string of LED chips can be connected in series over a second portion of component 80 as indicated by S2. In some aspects, each string can comprise five or more LED chips, 10 or more LED chips, 20 or more LED chips, or more than 20 LED chips. More than two strings (e.g., S1, S2, etc.) of LED chips can be provided per device. In some aspect, each string of LED chips and/or LED packages (not shown) can be electrically connected in series. In other aspects, connecting strings of serially connected LED chips/packages in parallel within component 80 is also contemplated.

Referring to FIGS. 5A and 5B, one or more attachment regions 102 can be provided along edges of component 80. In some aspects, attachment members (e.g., screws, bolts, rivets, pins, nails, clips, hooks, etc.) can be configured to become at least partially secured within regions 102 thereby affixing component 80 to a portion of a lighting fixture or device.

Figure 6:
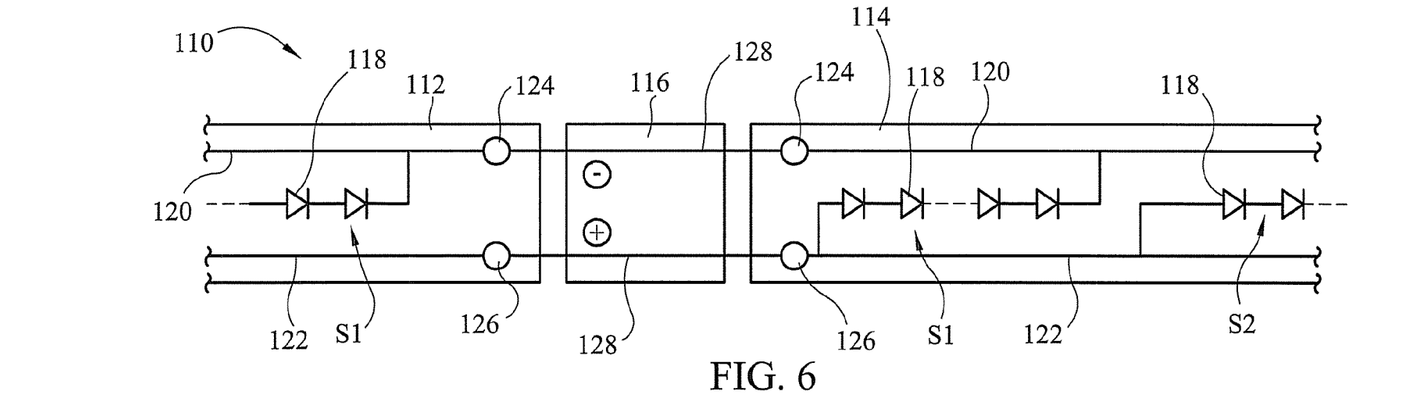
FIG. 6 is a schematic circuit diagram illustrating electrical connectivity within a connector system according to one aspect of the disclosure herein.

FIG. 6 is a schematic circuit diagram illustrating electrical connectivity of components within a connector system, generally designated 110. System 110 can comprise a first component 112, a second component 114, and a connector device 116 disposed therebetween. As FIG. 6 illustrates, multiple LED devices 118 can be provided and electrically connected in series over each of first and second components 112 and 114, respectively. LED devices 118 can comprise COB LED chips and/or packaged LED chips. Each component can comprise a first bus bar 120 and a second bus bar 122 of opposing electrical polarity. Bus bars 120 and 122 can convey electrical current between first and second attachment area 124 and 126 of each connector, which also have opposing electrical polarity.

As FIG. 6 illustrates, connector device 116 can convey electrical current between attachment surfaces 124 and 126 of a same electrical polarity via parallel traces 128 of opposing electrical polarity. As FIG. 6 further illustrates, each component 112 and 114 can comprise multiple strings of LED chips 118 which can terminate between bus bars 120 and 122. As FIG. 6 illustrates, components can comprise a plurality of strings of LED devices 118, designated S1 and S2. In some aspects, each string S1 and S2 of LED devices 118 can be connected in parallel between opposing bus bars. In some aspects, each component comprises only a single string S1 of serially connected LED devices 118. In other aspects, each component comprises more than one and/or more than two strings of LED chips. In some aspects, serially connected strings S1, S2, . . . SN are contemplated.

Figure 7:
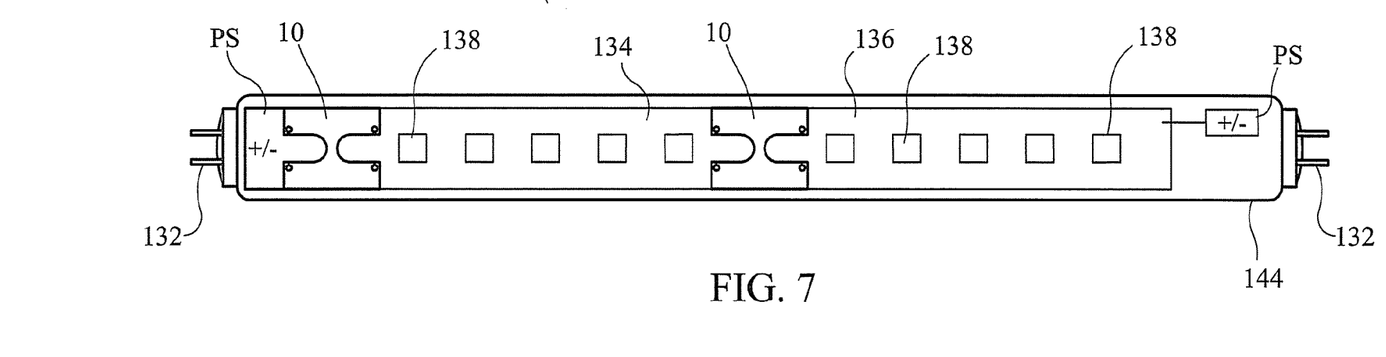
FIG. 7 is a top plan view illustrating a lighting product incorporating connector devices and systems according to one aspect of the disclosure herein.

FIG. 7 illustrates a light emitter component system comprising a lighting fixture, including but not limited to a bulb (e.g., the T8 fluorescent format) which can be used in overhead lighting. Multiple types of lighting fixtures, bulbs, and/or products can be provided and are contemplated herein. FIG. 7 illustrates another embodiment of a connector system generally designated 130. Connector system 130 can comprise more than one light emitter component, such as first and second components 134 and 136. One or more strings of LED devices 138 (e.g., chips or LED packages) can be provided over each component. Notably, LED devices 138 can directly attach to portions of exposed metal (e.g., exposed portions of traces) disposed on each component, obviating the need for wirebonding the chips. Each elongated component can be disposed end-to-end and connected via a connector device 10, as previously described. More than two components can be attached end-to-end, or only one component can be used within the fixture, depending upon the size requirements.

Light emitter components 134 and 136 may not be visible from outside of system 130, in some aspects, a system housing 144 can obstruct the view, however, such components are shown herein for illustration purposes. In some aspects, light emitter components 134 and 136 can be physically and/or electrically coupled as via device 10. In some aspects, connector system 130 can be disposed within a bulb for use in strip lighting, tube lighting and/or overhead lighting products. System 130 can comprise two pins 132 disposed at each end. Electrical current can pass into system 130 via pins 132. In some aspects, light emitter components 134 and 136 can receive current by coupling the ends to a positive or negative terminal of a power source PS. In some aspects, power source PS can receive power from pins 132. Notably, as FIG. 7 illustrates, connector devices 10 can also be provided between outermost portions of at least one component (e.g., 134) and wherein the component connects to power source PS. In some aspects, emitter components 134 and 136 can be contained within a system or bulb housing 144. In some aspects, housing 144 can comprise a tube diffuser. For illustration purposes, system 130 is shown as an elongated bulb used in lighting products, however, any other system, bulb, or lighting fixture can be provided.

As described above, novel connector devices and light emitter components can be provided alone and/or in combination for providing components and systems having improved optical performance at a lower cost. Embodiments as disclosed herein may provide one or more of the following beneficial technical effects: improved brightness; improved light extraction; improved efficiency; reduced manufacturing cost of light emitter components and/or systems; improved thermal management (and concomitant improvement of operating life); and/or improved manufacturability of light emitter components.

While the subject matter herein has been has been described in reference to specific aspects, features, and/or illustrative embodiments, it will be appreciated that the utility of the described subject matter is not thus limited, but rather extends to and encompasses numerous other variations, modifications and alternative embodiments, as will suggest themselves to those of ordinary skill in the field of the present subject matter, based on the disclosure herein. Various combinations and sub-combinations of the structures and features described herein are contemplated and will be apparent to a skilled person having knowledge of this disclosure. Any of the various features and elements as disclosed herein may be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

What is claimed is:

1. A connector device for light emitter components, the device comprising:
   a body comprising a first end and a second end, wherein the first end of the body is configured to physically couple to a first light emitter board, and wherein the second end of the body is configured to physically couple to a second light emitter board for facilitating end-to-end coupling of the first light emitter board to the second light emitter board; and
   at least a first trace and a second trace disposed within portions of the body;
   wherein portions of each of the first and second traces are electrically and physically connectable to each of the first and second light emitter boards via an attachment material;
   wherein the connector is devoid of light emitters; and
   wherein the body is thinner than each of the first and the second light emitter boards to which the body is coupled.

2. The device of claim 1, wherein the body is flexible.

3. The device of claim 1, wherein the body comprises a thickness that is between approximately 50 µm and 150 µm.

4. The device of claim 1, wherein the body is substantially H-shaped.

5. The device of claim 1, wherein the body reflects light.

6. The device of claim 1, wherein the body is white.

7. The device of claim 1, wherein the body is coated with a wavelength conversion material.

8. The device of claim 7, wherein the wavelength conversion material comprises a phosphor.

9. The device of claim 1, wherein the body comprises multiple layers of material.

10. The device of claim 1, wherein the body comprises a dielectric layer of material, a conductive layer of material, and a non-metallic reflective layer of material.

11. The device of claim 10, wherein the dielectric layer of material comprises FR-4 or related materials.

12. The device of claim 1, further comprising multiple traces.

13. The device of claim 1, wherein the attachment material comprises solder.

14. A method of providing a connector device for light emitter components, the method comprising:
   providing a connector device, the device comprising:
      a body comprising a first end and a second end, wherein the first end of the body is configured to physically couple to a first light emitter board, and wherein the second end of the body is configured to physically couple to a second light emitter board for facilitating end-to-end coupling of the first light emitter board to the second light emitter board; and
      first and second traces disposed within portions of the body;
      wherein portions of each of the first and second traces are electrically and physically connectable to each of the first and second light emitter boards via an attachment material; and
      wherein the connector is devoid of light emitters; and
   electrically connecting the connector device to the first light emitter board, wherein the body is thinner than the first light emitter board to which the body is connected.

15. The method of claim 14, wherein providing the connector device comprises providing a body that is 100 µm or more in thickness.

16. The method of claim 14, wherein providing the connector device comprises providing a white, reflective body.

17. The method of claim 14, further comprising coating the body with wavelength conversion material.

18. The method of claim 14, wherein providing the connector device comprises providing a multilayered body including a dielectric layer of material, an electrically conductive layer of material, and a non-metallic layer of material.

19. The method of claim 14, further comprising soldering the connector device to the first light emitter component.

* * * * *